(12) United States Patent
Murai et al.

(10) Patent No.: US 8,617,918 B2
(45) Date of Patent: Dec. 31, 2013

(54) THERMOELECTRIC CONVERTER AND METHOD THEREOF

(75) Inventors: Junya Murai, Susono (JP); Takuji Kita, Numazu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 520 days.

(21) Appl. No.: 12/602,820

(22) PCT Filed: Jun. 5, 2008

(86) PCT No.: PCT/JP2008/060732
§ 371 (c)(1),
(2), (4) Date: Dec. 3, 2009

(87) PCT Pub. No.: WO2008/150026
PCT Pub. Date: Dec. 11, 2008

(65) Prior Publication Data
US 2010/0170552 A1 Jul. 8, 2010

(30) Foreign Application Priority Data
Jun. 5, 2007 (JP) ................................. 2007-149216

(51) Int. Cl.
*H01L 21/00* (2006.01)
*H01L 35/16* (2006.01)
*H01L 35/00* (2006.01)

(52) U.S. Cl.
USPC ............... 438/95; 136/238; 136/340; 438/84; 438/93

(58) Field of Classification Search
USPC ............. 136/200, 206, 263.1, 238, 239, 240, 136/241; 432/1, 23, 13, 69, 87, 99, 111, 432/112, 138, 28; 423/1, 23, 13, 69, 87, 99, 423/111, 112, 138, 28; 438/84, 93, 95
See application file for complete search history.

(56) References Cited

U.S. PATENT DOCUMENTS

| | | | |
|---|---|---|---|
| 4,992,235 A * | 2/1991 | Tokiai et al. ................ 419/23 |
| 6,261,469 B1 | 7/2001 | Zakhidov et al. | |
| 2005/0268956 A1 | 12/2005 | Take | |
| 2005/0284512 A1 | 12/2005 | Heremans et al. | |
| 2010/0212328 A1 | 8/2010 | Murai et al. | |

FOREIGN PATENT DOCUMENTS

| | | |
|---|---|---|
| CN | 1569648 | 1/2005 |
| EP | 1 959 508 A1 | 8/2008 |
| EP | 2 154 734 A1 | 2/2010 |

(Continued)

OTHER PUBLICATIONS

Kim et al "Thermal Conductivity Reduction and Thermoelectric Figure of Merit Increase by Embedding Nanoparticles in Crystalline Semiconductors", Physical Review Letters, Colume 96 Issue 4, Feb. 2, 2006 pp. 045901-1-045901-4.*

(Continued)

*Primary Examiner* — Alexander Kollias
(74) *Attorney, Agent, or Firm* — Finnegan, Henderson, Farabow, Garrett & Dunner, LLP

(57) ABSTRACT

A thermoelectric converter is made of a first thermoelectric conversion material in which at least one type of second thermoelectric conversion material particles having an average size of 1 to 100 nm is dispersed. At least a part of the second thermoelectric conversion material particles is dispersed at a distance not more than the mean free path of the phonons of the first thermoelectric conversion material.

1 Claim, 5 Drawing Sheets

(56) References Cited

FOREIGN PATENT DOCUMENTS

| | | |
|---|---|---|
| EP | 2 154 735 A1 | 2/2010 |
| EP | 2 154 736 A1 | 2/2010 |
| JP | 06-163996 | 6/1994 |
| JP | 06-204571 | 7/1994 |
| JP | 09-074229 | 3/1997 |
| JP | 10-060563 | 3/1998 |
| JP | 10-242535 | 9/1998 |
| JP | 11-097750 | 4/1999 |
| JP | 11-317548 | 11/1999 |
| JP | 2000-164940 | 6/2000 |
| JP | 2000-261047 | 9/2000 |
| JP | 2000-261048 | 9/2000 |
| JP | 2001-185767 | 7/2001 |
| JP | 2003-73705 | 3/2003 |
| JP | 2003-225743 | 8/2003 |
| JP | 2004-363576 | 12/2004 |
| JP | 2005-294478 | 10/2005 |
| JP | 2005-325419 | 11/2005 |
| JP | 2005-343782 | 12/2005 |
| JP | 2006-237461 | 9/2006 |
| JP | 2007-21670 | 2/2007 |
| JP | 2008-305907 | 12/2008 |
| JP | 2008-305919 | 12/2008 |
| WO | WO 2008/041951 * | 4/2008 ............... G01G 1/00 |
| WO | WO 2008/048302 * | 4/2008 ............... H01L 35/28 |
| WO | WO 2008/150026 A1 | 12/2008 |

OTHER PUBLICATIONS

International Search Report in International Application No. PCT/JP2008/060244; Mailing Date: Sep. 2, 2008.
U.S. Appl. No. 13/377,876, filed Dec. 13, 2011.
International Search Report in International Application No. PCT/IB2010/00153; Mailing Date: Apr. 11, 2011.
Kim et al., "Thermal Conductivity Reduction and Thermoelectric Figure of Merit Increase by Embedding Nanoparticles in Crystalline Semiconductors," Physical Review Letters, Colum 96, Issue 4, Feb. 2, 2006 (pp. 045901-1-045901-4.
Written Opinion of the International Searching Authority in International Application No. PCT/IB2010/001533; Mailing Date: Apr. 11, 2011.
Applicant's Reply in International Application No. PCT/IB2010/00153 (Jul. 1, 2011).
Office Action dated Jul. 19, 2012 in U.S. Appl. No. 12/663,019.
Extended European Search Report for EP Appl. No. 08765503.1 dated Apr. 5, 2012.

* cited by examiner

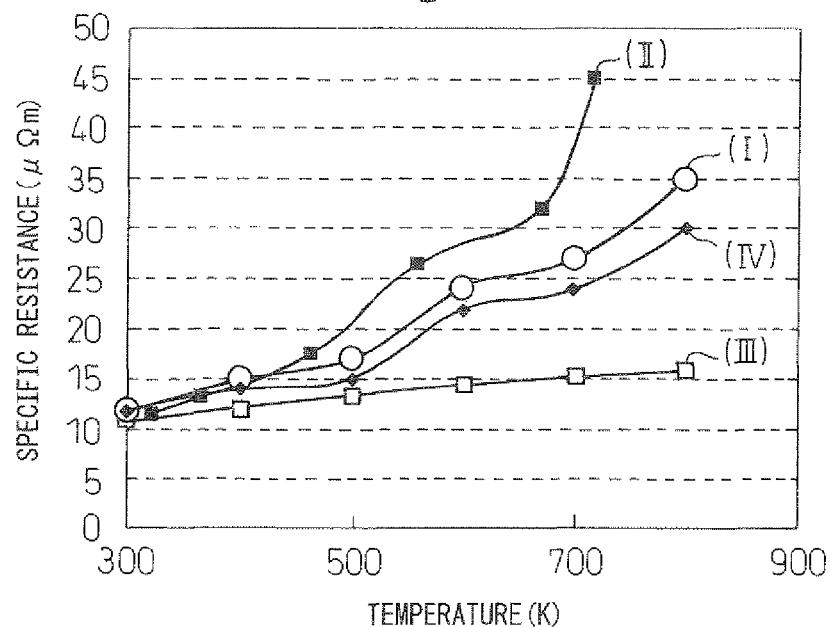
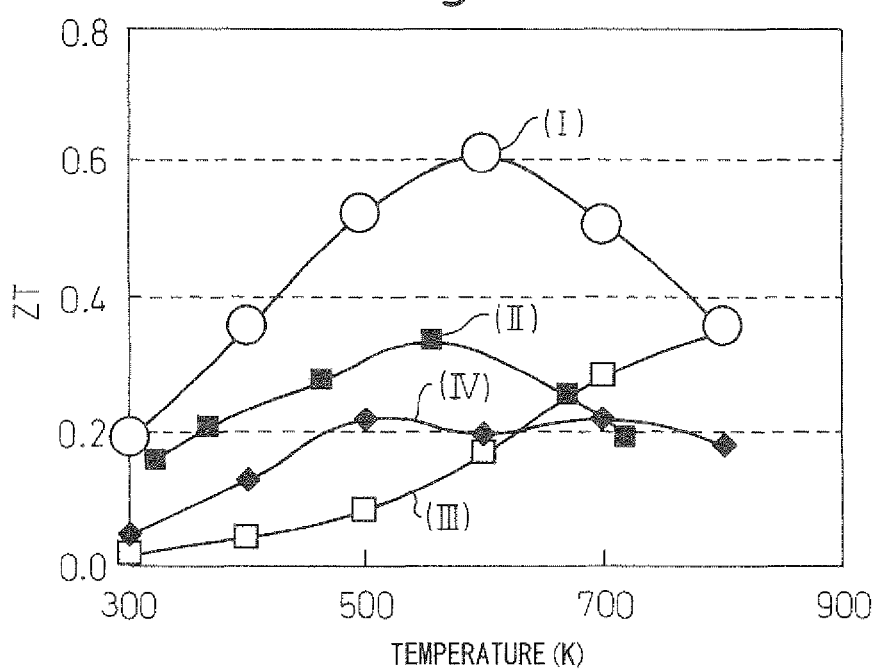

US 8,617,918 B2

THERMOELECTRIC CONVERTER AND METHOD THEREOF

CROSS-REFERENCE TO RELATED APPLICATIONS

This application is a national phase application of International Application No. PCT/JP2008/060732, filed Jun. 5, 2008, and claims the priority of Japanese Application No. 2007-149216, filed Jun. 5, 2007, the contents of both of which are incorporated herein by reference.

FIELD OF INVENTION

The present invention relates to a thermoelectric converter made of two or more kinds of thermoelectric conversion materials and a method for manufacturing the same.

BACKGROUND ART

A thermoelectric conversion material is a material which can interconvert thermal and electric energies, and constitutes a thermoelectric converter which is used as a thermoelectric cooling element or a thermoelectric power generating element. Thermoelectric conversion material is used for thermoelectric conversion using the Seebeck effect. Thermoelectric converting performance is represented by Formula (I) which is called the performance index ZT.

$$ZT = \alpha^2 \sigma T / \kappa \quad (1)$$

(wherein, $\alpha$ represents the Seebeck coefficient, $\sigma$ represents the electrical conductivity, $\kappa$ represents the thermal conductivity, and T represents the measured temperature.)

It is apparent, according to Formula (I), that in order to improve the thermoelectric converting performances of a thermoelectric conversion material, Seebeck coefficient $\alpha$ and electrical conductivity $\sigma$ of the material are increased, and thermal conductivity $\kappa$ of the material is decreased. Japanese unexamined patent publication No. 10-242535 describes an addition of fine particles, which is inactive to the base material of the thermoelectric conversion material (inactive fine particle), to the starting material particles in order to decrease thermal conductivity $\kappa$ of the material. Thereby, the inactive fine particles can scatter phonons, which are the major factor of the thermal conduction in a thermoelectric conversion material, to decrease thermal conductivity $\kappa$.

However, in a conventional conversion material in which the inactive fine particles are unevenly distributed, the inactive fine particles, which provide the scattering effect of the phonon, have a large adverse influence on the other physical properties, such as electrical resistivity, due to the uneven distribution thereof, thus an increase in the performance of the thermoelectric conversion materials is inhibited.

Since the thermoelectric conversion material is highly temperature-dependent, the material must be selected according to the temperature at which it is used. For example, $Bi_2Te_2$ type material is used in a low temperature range, PbTe type material is used in a medium temperature range, and SiGe type material is used in a high temperature range. In this connection, Japanese unexamined patent publication No. 10-60563 has proposed a composite thermoelectric conversion material wherein atoms are filled in holes in the structure.

According to the art disclosed in Japanese unexamined patent publication No 10-242535 above, the microparticulation of the starting material in addition to the inactive fine particles to be dispersed makes it possible for the inactive fine particles to be easily dispersed in the entirety of the base material, thus leading to a high probability of the presence of the inactive fine particles between the starting material particles, whereby no crystallization of the starting material particles occurs. However, in the known arts shown above, the inactive fine particles are evenly dispersed to adjust other physical properties, which do not directly relate to the equation (1), such as the electrical resistivity, but the electrical conductivity $\sigma$ and the thermal conductivity $\kappa$, both directly relating to the performance index ZT in the equation (1), have not been studied. Therefore, the inactive fine particles in the known arts above have a microscale diameter. The dispersion state of the inactive fine particles has not been precisely studied.

According to the art disclosed in Japanese unexamined patent publication No. 10-60563 above, the compounding extends the effective usable temperature range, but satisfactory properties are not obtained over a wide temperature range.

Therefore, the object of the present invention is to eliminate the drawbacks of the prior art stated above by providing a thermoelectric converter having a good performance index and a wide usable temperature range, and a method for manufacturing the same.

DISCLOSURE OP THE INVENTION

In order to achieve the object shown above, according to a first aspect of the invention, there is provided a thermoelectric converter comprising a first thermoelectric conversion material in which at least one type of second thermoelectric conversion material particles having an average size of 1 to 100 nm is dispersed, and at least a part of the second thermoelectric conversion material particles is dispersed at a distance not more than the mean free path of phonons of the first thermoelectric conversion material.

In order to achieve the object shown above, according to a second aspect of the invention, at least a part of the second thermoelectric conversion material particles in the first aspect of the invention is dispersed at a distance not less than the mean free path of a carrier of the first thermoelectric conversion material In order to achieve the object shown above, according to a third aspect of the invention, there is provided a method for manufacturing a thermoelectric converter, comprising the steps of:

mixing first thermoelectric conversion material particles having an average particle size of 1 to 100 nm, second thermoelectric conversion material particles having an average particle size of 1 to 100 nm, and a pH controlling agent to prepare a dispersion liquid of the first thermoelectric conversion material particles and the second thermoelectric conversion material particles; and aggregating the first thermoelectric conversion material particles and the second thermoelectric conversion material particles by changing the pH of the dispersion liquid; and sintering the aggregate.

According to the first aspect, the second thermoelectric conversion material particles are dispersed as a dispersion phase in the continuous phase of the first thermoelectric conversion material, and the dispersion distance of the second thermoelectric conversion material particles is equal to or smaller than the mean free path of the phonons of the first thermoelectric conversion material. Consequently, the phonon scattering is facilitated at the interface of the dispersion phase and the continuous phase, thus resulting in a remarkable decrease of the lattice thermal conductivity and an enhancement of the performance of the thermoelectric converter. The usable temperature range can be further extended by selecting the first and the second thermoelectric conversion materials having different usable temperature ranges than selecting a single thermoelectric conversion material.

As the carrier (an electron or an electron hole) can carry both heat and electricity, electrical conductivity σ and thermal conductivity κ are proportional. But, if the dispersion distance of the particles of the second thermoelectric conversion material dispersed in the first thermoelectric conversion material is equal to or more than the mean free path of the carrier of the thermoelectric conversion material, the performance index ZT is increased as a result because the decrease rate of the thermal conductivity κ is larger than the decrease rate of electrical conductivity. Additionally, in general, as electrical conductivity σ and Seebeck coefficient α are inversely proportional, Seebeck coefficient α is increased when electrical conductivity decreased. Namely, in the second aspect, as decrease rate of the thermal conductivity κ, i.e., the denominator of the right side of the formula (1), is larger than the decrease rate of the electrical conductivity σ, i.e., the numerator, and the value α of the numerator is increased, so that the performance index ZT represented by the formula (1) is also increased.

According to the third aspect, the first thermoelectric conversion material particles and the thermoelectric conversion material particles, having a nanoscale diameter, are mixed and evenly dispersed in alcohol. In this state, the pH is changed to aggregate the particles at once. As a result, both the first thermoelectric conversion material particles and the thermoelectric conversion material particles are evenly dispersed and aggregated, without forming a collection of the first thermoelectric conversion material particles or the second thermoelectric conversion material particles into a mass, thus, the dispersion distance of the second thermoelectric conversion material particles can be made not more than the mean free path of the phonons of the first thermoelectric conversion material.

BRIEF DESCRIPTION OF THE DRAWINGS

FIG. 3(a) represents a preparation of a dispersion liquid, FIG. 3(b) represents an aggregate, and FIG. 3(c) represents a sintered body.

FIG. 7 is a graph representing the result of a measurement of the specific resistance.

FIG. 8 is a graph representing the calculated performance index.

DESCRIPTION OF THE PREFERRED EMBODIMENT

Figure 1:
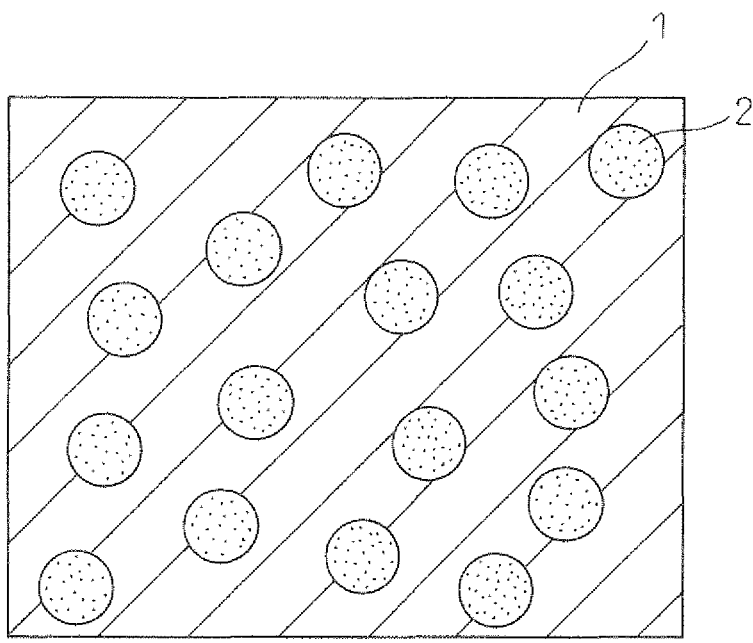
FIG. 1 is a schematic diagram representing the method for manufacturing of the present invention.

According to the features of the thermoelectric converter of the present invention, as shown in FIG. 1, the particles of the second thermoelectric conversion material 2 having the average diameter of 1 to 100 nm are dispersed in the first thermoelectric conversion material 1, and at least a part of the second thermoelectric conversion material particles is dispersed at a distance not more than the mean free path of the phonons of the first thermoelectric conversion material.

Figure 2:
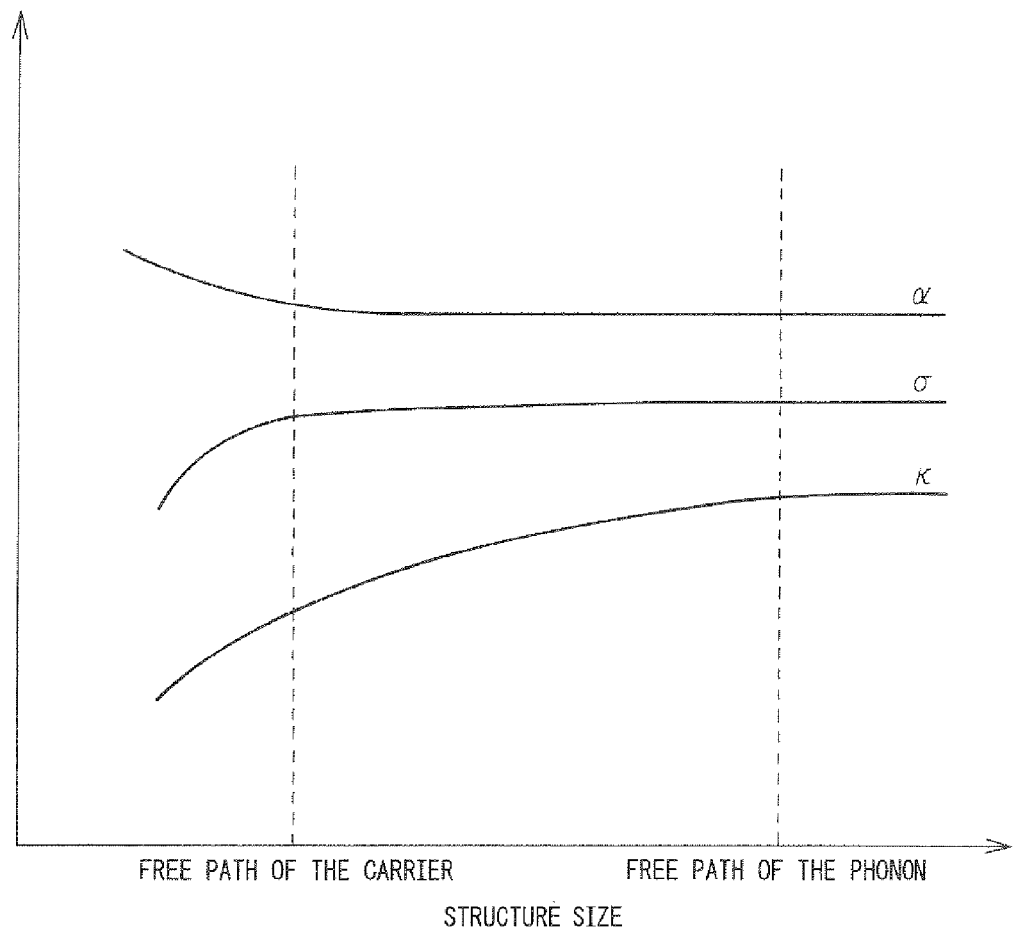
FIG. 2 is a graph representing the relationship of the structure size of the thermoelectric conversion material to Seebeck coefficient α, electrical conductivity σ, or thermal conductivity κ.

The relationship between the performance index ZT and the structure constitution of the thermoelectric conversion material is explained in detail referring to FIG. 2. As shown in FIG. 2, thermal conductivity κ of the thermoelectric conversion material is gradually decreased as the structure size of the thermoelectric conversion material becomes smaller than the length of the mean free path of the phonons. Therefore, performance index ZT is improved when the structure size is designed to be less than the mean free path of the phonons.

On the other hand, if the structure size of the thermoelectric conversion material becomes smaller than the mean free path of the phonons, electrical conductivity σ does not decrease, but when the structure size becomes a particle size approximately equal to the length of the mean free path of the carrier or less, electrical conductivity σ decreases. Based on the fact that the structure size of the thermoelectric conversion material at which thermal conductivity κ begins decreasing is different from the structure size of the thermoelectric conversion material at which electrical conductivity σ begins decreasing, performance index ZT represented by the formula (1) above can be further increased by selecting the structure size of the thermoelectric conversion material to be larger than the mean free path of a carrier and smaller than the mean free path of the phonons, so that the decreasing rate of thermal conductivity κ is higher than the decreasing rate of the electrical conductivity.

What determines the structure size of the thermoelectric conversion material is the diameter of the particles dispersed in the thermoelectric conversion material, or the dispersion distance between the particles. Therefore, in the present invention, the dispersion distance between the particles of the second thermoelectric conversion material dispersed in the first thermoelectric conversion material is controlled so as to obtain the effect mentioned above.

That is, in the present invention, the distance between the particles of the second thermoelectric conversion material dispersed in the first thermoelectric conversion material is less than or equal to the length of the mean free path of the phonons of the first thermoelectric conversion material, preferably, at least the mean free path of the carrier of the first thermoelectric conversion material and not more than the mean free path of the phonons of the first thermoelectric conversion material. Specifically, the distance is preferably in the range of 1 nm to 100 nm, and more preferably 10 nm to 100 nm.

The mean free path (MFP) is calculated by the formula below.

$$\text{Carrier MFP} = (\text{"mobility"} \times \text{"effective mass"} \times \text{"carrier velocity"}) / \text{"elementary electric charge"}$$

$$\text{Phonon MFP} = 3 \times \text{"lattice thermal conductivity"} / \text{"specific heat"} / \text{"acoustic velocity"}$$

In the formulae above, each value is obtained from the reference values and the approximation formula for the thermal properties, except that the measured value is used only for the specific heat.

The result of the calculated carrier MFP and the phonon MFP for $CoSb_3$ are shown below.

TABLE 1

Calculated result of the carrier MFP
and the phonon MFP (mean free path)

| Material | Temperature | Carrier MFP (nm) | Phonon MFP (nm) |
|---|---|---|---|
| $CoSb_3$ | 300 K | 0.8 | 85 |
| | 673 K | 1 | 42 |

The carrier MET and the phonon MFP are determined by the material and the temperature. As can be seen above, as $CoSb_3$ exhibits the highest performance at 400° C. (673K), the mean free path at 400° C. is used.

When the dispersion distance is not more than the mean free path of the phonons of the first thermoelectric conversion material, preferably 100 nm or less, the phonons scatter to a satisfactory extent and thermal conductivity κ of the thermoelectric converter is decreased. From the point of view of the decrease in frequency of scattering of the carrier, the distance is preferably 1 nm or more. Additionally, in order to improve the performance index ZT by making the decreasing rate of thermal conductivity κ larger than the decreasing rate of electrical conductivity σ, which is in turn caused by making the dispersion distance not less than the mean free path of the carrier of the first thermoelectric conversion material, the distance is more preferably 10 nm or more.

In addition, in the present invention, the second thermoelectric conversion material particles having the dispersion distance described above are not less than 50 vol. %, preferably 70 vol. %, more preferably 90 vol. %, with respect to all the second thermoelectric conversion material particles in the thermoelectric converter. If the reduced volume is less than 50 vol. %, the phonons may not scatter to a satisfactory extent, resulting in no decrease of thermal conductivity κ.

As described above, the diameter of the second thermoelectric conversion material particles dispersed in the first thermoelectric conversion material is not more than the mean free path of the phonons of the second thermoelectric conversion material, specifically, 1 to 100 nm. If the diameter of the second thermoelectric conversion material particles is not more than the mean free path of the phonons, the phonons scatter to a satisfactory extent due to the presence of the second thermoelectric conversion material particles, thermal conductivity κ decreases, and as a result, the performance index ZT increases.

In the present invention, the second thermoelectric conversion material particles are not less than 50 vol. %, preferably 70 vol. %, more preferably 95 vol. %, with respect to all the second thermoelectric conversion material particles in the thermoelectric converter. If the reduced volume is less than 50 vol. %, the phonons may not scatter to a satisfactory extent, resulting in no decrease of the thermal conductivity κ.

In the present invention, both the first and the second thermoelectric conversion materials may be of P-type or N-type. The material for P-type thermoelectric conversion material is not specifically limited. For example, $Bi_2Te_3$ type material, PbTe type material, $Zn_4Sb_3$ type material, $CoSb_3$ type material, half Heusler type material, full Heusler type material, SiGe type material, etc., can be used. Likewise, the material for N-type thermoelectric conversion material is not specifically limited, and known material, such as $Bi_2Te_3$ type material, PbTe type material, $Zn_4Sb_3$ type material, $CoSb_3$ type material, half Heusler type material, full Heusler type material, SiGe type material, $Mg_2Si$ type material, $Mg_2Sn$ type material, or CoSi type material, can be used.

The thermoelectric conversion material used in the present invention preferably has an output factor of not less than 1 $mW/K^2$, and more preferably, not less than 2 $mW/K^2$, and most preferably, not less than 3 $mW/K^2$. If the output factor is smaller than 1 $mW/K^2$, a dramatic improvement in the performance can not be expected. Thermal conductivity κ of the thermoelectric conversion material is preferably more than 5 W/mK, more preferably more than 7 W/mK, and most preferably is more than 10 W/mK. Particularly, if thermal conductivity is more than 5 W/mK, the effect of the present invention is remarkable. Namely, when the structure size of the thermoelectric conversion material is controlled at the nanoscale as specified in the present invention, there is a tendency that the use of the thermoelectric conversion material having a higher thermal conductivity κ brings about a greater reduction of thermal conductivity κ, and particularly, when the thermoelectric conversion material having a thermal conductivity κ of more than 5 W/mK is used, the reducing effect of thermal conductivity κ is enhanced.

As mentioned above, as the thermoelectric conversion material has a high temperature dependence, it is preferable that the first and the second thermoelectric conversion material to be combined have different usable temperature ranges. The examples of the combination of the first and the second thermoelectric conversion materials are as follows: BiTe/CoSb, HiTe/PbTe, PbTe/SiGe, BiTe/SiGe, BiTe/half Heusler, CoSb/SiGe, and half Heusler/SiGe.

Next, the method for manufacturing the thermoelectric converter is described in detail. The method for manufacturing a thermoelectric converter of the present invention comprises:

mixing the first thermoelectric conversion material particles having an average particle diameter of 1 to 100 nm, the second thermoelectric conversion material particles having an average particle diameter of 1 to 100 nm, and the pH controlling agent and preparing a dispersion liquid containing the first thermoelectric conversion material particles and the second thermoelectric conversion material particles;

aggregating the first and the second thermoelectric conversion material particles by changing the pH of the dispersion liquid; and sintering the aggregate.

At first, a solution or a slurry containing the first thermoelectric conversion material particles having an average diameter of 1 to 100 nm is prepared. A particle having an average diameter of 1 to 100 nm is prepared by various methods. Preferably, the reduction is performed in a solution or a slurry containing a salt of the element constituting the thermoelectric conversion material and the particles of the element constituting the thermoelectric conversion material obtained thereby are subsequently subject to heating for preparation.

Specifically, a nanoscale particle is prepared by a method in which a solution or a slurry containing a salt of an element constituting the thermoelectric conversion material is dropped into a solution containing a reducing agent to deposit an atom by reducing an ion constituting the salt. The salts of the element constituting the thermoelectric conversion material mean, for, example, cobalt chloride hydrate and antimony chloride in the case the thermoelectric conversion material is $CoSb_3$, and mean cobalt chloride hydrate, nickel chloride, and antimony chloride in the case the thermoelectric conversion material is $Co_{0.94}Ni_{0.06}SB_3$. The amount of the salt of an element constituting the thermoelectric conversion material to be contained in a liquid or a slurry is not specifically limited, and it is preferable that the amount of the salt be appropriately adjusted according to the type of the raw material of the solvent. As long as the solvent can dissolve or disperse a salt of an element constituting the thermoelectric conversion material, the solvent is not specifically limited. The solvent includes an alcohol or a water, and ethanol is preferable. As long as the reducing agent can reduce the ion of an element constituting the thermoelectric conversion material, the type of reducing agent is not limited, and a reducing agent such as $BaBH_4$ or hydrazine can be used.

A particle of an element constituting thus obtained thermoelectric conversion material is heat-treated by, for example, an autoclave. A thermoelectric conversion material is hydrothermally-synthesized from the particle of an element constituting the thermoelectric conversion material by the heat treatment. As the time or the temperature of the heat treatment is dependent on the type and the content rate of the solvent or the thermoelectric conversion material, it is preferable that the time or the temperature is appropriately adjusted.

A solution or a slurry containing the second thermoelectric conversion material particles having an average diameter of 1 to 100 nm is prepared by the same method described above.

Figure 3:
FIG. 3 is a diagram representing the manufacturing process of the thermoelectric converter of the present invention.
Figure 3:
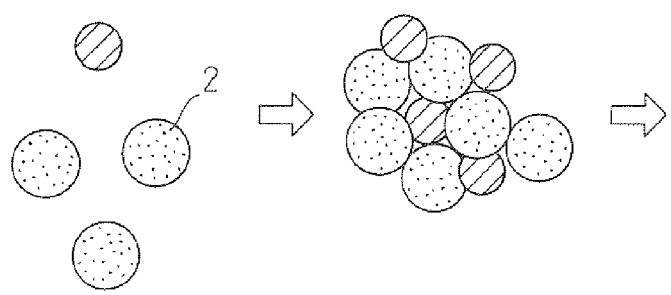
Figure 3:
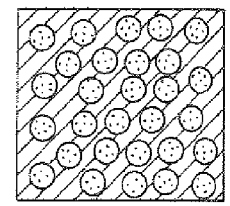

As shown In FIG. 3, thus obtained first thermoelectric conversion material particles 1 and the second thermoelectric conversion material particles 2 are mixed with a pH controlling agent to prepare a dispersion liquid (FIG. 3(a)). As long as the solvent can disperse the thermoelectric conversion material particles and the ph controlling agent, the solvent is not specifically limited. The solvent includes an alcohol or a water, and ethanol is preferable. As a pH controlling agent, which is used to prevent the aggregation of the thermoelectric conversion material particles, known agents such as nitric acid, ammonia water, or sodium borohydride ($NaBH_4$) can be used. The pH of the dispersion liquid is preferably prepared to be 10.

After the dispersion liquid comprising the first thermoelectric conversion material particles and the second thermoelectric conversion material particles is thus prepared, the first thermoelectric conversion material particles and the second thermoelectric conversion material particles are aggregated at once by changing the pH of the dispersion liquid. Specifically, if $Bi_2Te_3$ is used as the first thermoelectric conversion material particle and $CoSb_3$ is used as the second thermoelectric conversion material particle, the isoelectric point of $Bi_2Te_3$ is 7 to 8, and that of $CoSb_3$ is 6 to 7, therefore, the dispersion state of the dispersion liquid of $Bi_2Te_3/CoSb_3$ can be maintained by maintaining the pH at 8 to 10, and adding HCl to the dispersion liquid to change the pH to 7 invites an even and rapid aggregation of $Bi_2Te_3$ and $CoSb_3$ (FIG. 3(b)).

The obtained aggregates are filled and sintered in the subsequent sintering step (FIG. 3c). In addition to the sintering step, a forming step forming the thermoelectric conversion material by pressurizing can be included. In the present invention, the sintering step and the forming step may be separately provided to individually perform the pressure forming and sintering, however, it is preferable that the sintering be performed while performing the pressurization forming. As methods for performing the sintering while performing the pressurization forming, any of hot press sintering, hot isostatic press sintering, spark plasma sintering, etc. may be used. Among them, the spark plasma sintering method is preferable because the temperature rising and the sintering in a short time are possible, and controlling the particle growth is easy by the method. The sintering temperature for the spark plasma sintering method is preferably 400 to 800° C., more preferably 450 to 650° C., in the case of CoSb, and is preferably 250 to 500° C., more preferably 300 to 400° C., in the case of BiTe. The sintering time is preferably not more than 90 minutes, more preferably not more 60 minutes. The applied pressure is preferably 20 MPa or more, more preferably 40 MPa or more.

Note that, the thermoelectric converter of the present invention may be produced by a method other than the above methods, for example, by producing particles of two or more types of thermoelectric conversion material, and mixing and sintering them. In any case, the structure size (diameter of the second thermoelectric conversion material particles or dispersion distance of the second thermoelectric conversion material particles) of the first thermoelectric conversion material becomes smaller than the mean free path of the phonons of the first thermoelectric conversion material and preferably larger than the mean free path of the carrier, so that the phonons in the first thermoelectric converter are sufficiently scattered and the thermal conductivity κ can be decreased. Consequently, a thermoelectric converter having a high performance index ZT represented by Formula (1) is obtained. As a result, a thermoelectric conversion material having a high performance index ZT represented by the formula (1) is obtained.

As can be seed above, a thermoelectric converter having a high performance index ZT more than 2, which was difficult to realize in the prior art, can be obtained by the method for manufacturing the thermoelectric converter according to the present invention.

EXAMPLE

Example 1

1.0 g of a reducing agent, sodium borohydride, was mixed in 100 mL of ethanol. On the other hand, 0.5 g of cobalt chloride and 1.44 g of antimony chloride were mixed in 100 mL of ethanol, and the solution was dropped into the sodium borohydride solution described above. Particles of cobalt and antimony formed thereby were washed by a mixed solution of ethanol and water (mixing ratio of 1:1) to remove impurities. A slurry containing the obtained particles of cobalt and antimony was hydro-thermally treated at 240° C. for 48 hours to prepare a $CoSb_3$ particle.

In the same way, 1.2 g of bismuth chloride and 1.54 g of tellurium chloride were mixed in 100 mL of ethanol, and the solution was dropped into the sodium borohydride solution described above. Particles of bismuth and tellurium formed thereby were washed by a mixed solution of ethanol and water (mixing ratio of 1:1) to remove impurities. A slurry containing the obtained particles of bismuth and tellurium was hydro-thermally treated at 200° C. for 24 hours to prepare a BiTe particle.

After that, a slurry containing the $CoSb_3$ particles was mixed with the slurry containing the BiTe particles, followed by mixing with water. At that time, the pH of the mixture was 8 to 10, and the particles were in a state of dispersion. HCl was added to the mixture to make the pH near neutral, so that the dispersed particles were aggregated. After that, the aggregate was dried and sintered by SPS at 350 to 400° C. to obtain the thermoelectric converter of the present invention, wherein 30 vol. % of BiTe particles were dispersed in $CoSb_3$.

Example 2

2.0 g of a reducing agent, sodium borohydride, was mixed in 100 mL of ethanol. On the other hand, 1.0 g of cobalt chloride, 3.2 g of antimony chloride, and 0.12 g of ferric chloride were mixed in 100 mL of ethanol, and the solution was dropped into the sodium borohydride solution described above. Particles of cobalt, antimony, and iron formed thereby were washed by a mixed solution of ethanol and water (mixing ratio of 1:1) to remove impurities. A slurry containing the obtained particles of cobalt, antimony, and iron was hydro-thermally treated at 240° C. for 48 hours to prepare a particle of $Co_{0.9}Fe_{0.1}Sb_3$.

In the same way, 0.11 g of antimony chloride and 0.2 g of tellurium chloride were mixed in 100 mL of ethanol, and the solution was dropped into a solution wherein 0.3 g of sodium borohydride is dissolved in 100 mL of ethanol. Particles of antimony and tellurium formed thereby were washed by a mixed solution of ethanol and water (mixing ratio of 1:1) to remove impurities. A slurry containing the obtained particles of antimony and tellurium was hydro-thermally treated at 2.00° C. for 24 hours to prepare a particle of $Sb_2Te_3$.

After that, a slurry containing the particles of $Co_{0.9}Fe_{0.1}Sb_3$ was mixed with a slurry containing the particles of $Sb_2Te_3$, followed by mixing with water. At that time, the pH of the mixture was 8 to 10, and the particles were in a state of dispersion. HCl was added to the mixture to make the pH near neutral, so that the dispersed particles were aggregated. After that, the aggregate was dried and sintered by SPS at 350 to 400° C. to obtain the thermoelectric converter of the present invention.

Figure 4:
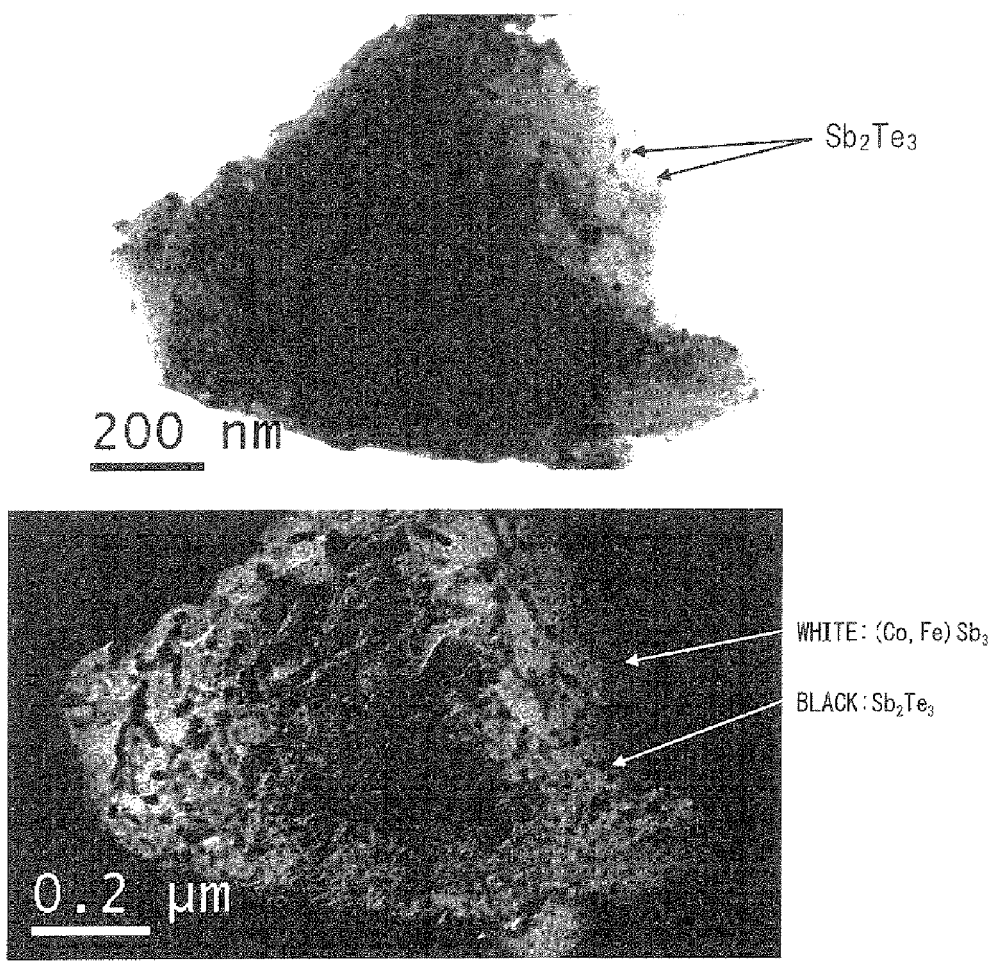
FIG. 4 shows a TEM image of a thermoelectric converter of the present invention.
Figure 5:
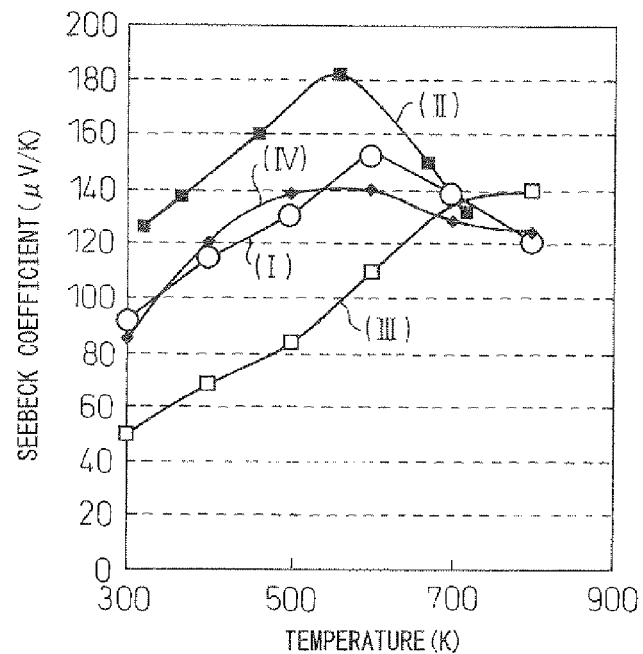
FIG. 5 is a graph representing the result of a measurement of the Seebeck coefficient.
Figure 6:
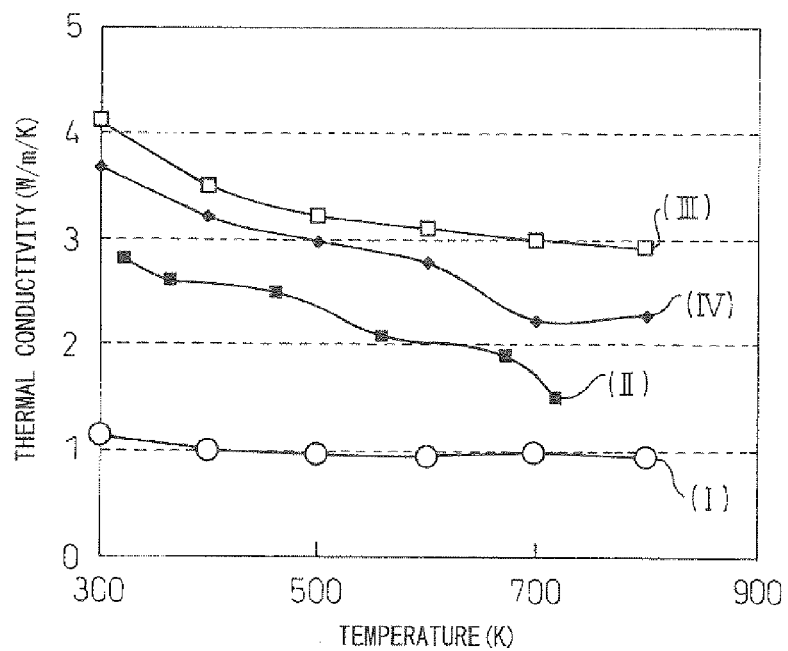
FIG. 6 is a graph representing the result of a measurement of the thermal conductivity.

The TEM image of thus obtained thermoelectric converter ((Co,Fe)$Sb_3$/30 vol. % $Sb_2Te_3$) is shown in FIG. 4. In the obtained thermoelectric converter, the dispersion phase of the second thermoelectric conversion material $Sb_2Te_3$ having the average particle diameter of 1 to 100 nm is evenly dispersed in the continuous phase of the first thermoelectric conversion material of $Co_{0.9}Fe_{0.1}Sb_3$ particles.

The Seebeck coefficient, the thermal conductivity κ, and the specific resistance (electrical conductivity σ) the obtained thermoelectric converter (I) were measured to calculate the performance index ZT. For comparison, the properties of $Sb_2Te_3$ (II), (Co,Fe)$Sb_3$ (III), and (Co,Fe)$Sb_3$/30 vol. % $Sb_2Te_3$, 10 μm (IV) were measured by the same method. The results are shown in FIGS. 5 to 8. The Seebeck coefficient was obtained by measuring the thermal electromotive force which was generated due to a temperature difference between sample pieces which were obtained by cutting the thermoelectric conversion material into pieces to which thermocouple wires were applied in a heating furnace. The thermal conductivity ac was calculated by multiplying the density measured by the volume method, the specific heat measured by DSC, and the thermal diffusivity measured by the laser flash method. The specific resistance was measured by Four-Probe Method. The performance index ZT was calculated according to Formula (I).

The invention claimed is:
1. A method of manufacturing a thermoelectric converter, the thermoelectric converter comprising a first thermoelectric conversion material in which at least one type of second thermoelectric conversion material particles having an average size of 1 to 100 nm is dispersed, at least part of the second thermoelectric conversion material particles is dispersed at a distance not more than the mean free path of a phonon of the first thermoelectric conversion material,
the method comprising:
mixing first thermoelectric conversion material particles having an average particle size of 1 to 100 nm, second thermoelectric conversion material particles having an average particle size of 1 to 100 nm, and a pH controlling agent to prepare a dispersion liquid of the first thermoelectric conversion material particles and the second thermoelectric conversion material particles;
aggregating the first thermoelectric conversion material particles and the second thermoelectric conversion material particles by changing the pH of the dispersion liquid; and
sintering the aggregate,
wherein a combination of the first and second thermoelectric conversion materials is selected from the group consisting of CoSb/BiTe and (Co, Fe)Sb/SbTe.

\* \* \* \* \*